United States Patent [19]

Hoover et al.

[11] Patent Number: 4,666,735
[45] Date of Patent: May 19, 1987

[54] PROCESS FOR PRODUCING PRODUCT HAVING PATTERNED METAL LAYER

[75] Inventors: Merwin F. Hoover, Topsfield; Ann B. Salamone, Marblehead; Jan Vandebult, Topsfield, all of Mass.

[73] Assignee: Polyonics Corporation, Newburyport, Mass.

[21] Appl. No.: 792,879

[22] Filed: Oct. 30, 1985

Related U.S. Application Data

[63] Continuation-in-part of Ser. No. 485,328, Apr. 15, 1983, Pat. No. 4,555,414.

[51] Int. Cl.$^4$ .............................................. B05D 3/06
[52] U.S. Cl. ................... 427/43.1; 427/54.1; 427/98; 430/417
[58] Field of Search ............ 427/43.1, 44, 54.1, 427/98; 430/315, 414, 417

[56] References Cited

U.S. PATENT DOCUMENTS

| | | | |
|---|---|---|---|
| 3,600,330 | 8/1971 | Schneble et al. ................... | 252/430 |
| 3,775,176 | 11/1973 | Cross et al. . | |
| 3,779,758 | 12/1973 | Polichette ........................... | 430/315 |
| 3,863,244 | 1/1975 | Lichtblau ........................... | 340/280 |
| 3,900,320 | 8/1975 | Rolker et al. . | |
| 3,907,621 | 9/1975 | Polichette ........................... | 430/414 |
| 3,925,578 | 12/1975 | Polichette et al. .................. | 427/304 |
| 3,967,161 | 6/1976 | Lichtblau ........................... | 317/101 |
| 4,006,047 | 2/1977 | Brummett et al. .................. | 156/656 |
| 4,021,705 | 5/1977 | Lichtblau ........................... | 361/402 |
| 4,073,981 | 2/1973 | Baron ................................. | 427/265 |
| 4,077,853 | 3/1978 | Coll-Palagos ...................... | 204/20 |
| 4,089,993 | 5/1978 | Shitahata et al. ................... | 427/129 |
| 4,100,037 | 7/1978 | Baron et al. . | |
| 4,133,908 | 1/1979 | Madsen ............................... | 427/53 |
| 4,167,601 | 9/1979 | Beckenbaugh et al. ............ | 428/209 |
| 4,181,750 | 1/1980 | Beckenbaugh et al. ............ | 430/414 |
| 4,192,764 | 3/1980 | Madsen ............................... | 430/455 |
| 4,216,246 | 8/1980 | Iwasaki et al. ..................... | 427/43.1 |
| 4,234,628 | 11/1980 | DuRose ............................... | 427/305 |
| 4,268,536 | 5/1981 | Beckenbaugh et al. ............ | 427/54.1 |
| 4,327,124 | 4/1982 | DesMaris, Jr. ..................... | 427/96 |
| 4,369,557 | 1/1983 | Vandebult .......................... | 29/25.42 |
| 4,404,237 | 9/1983 | Eichelberger ...................... | 427/96 |
| 4,470,883 | 9/1984 | Eichelberger ...................... | 204/15 |
| 4,486,463 | 12/1984 | Rubner et al. ..................... | 427/53.1 |
| 4,526,807 | 7/1985 | Auerbach ........................... | 427/53.1 |

FOREIGN PATENT DOCUMENTS

DD213311  3/1984  German Democratic Rep. .

Primary Examiner—John H. Newsome
Attorney, Agent, or Firm—Paul J. Cook

[57] ABSTRACT

A multilayered composite product useful as an electrical circuit is produced by coating a base with a photoimagable resin free of catalyst or catalyst activator for electroless metal deposition. The resin is patterned by exposure to a desired light, through a mask followed by development. The patterned cured resin is selectively chemically modified while avoiding chemical modification of the base to render the cured resin receptive to a metal catalyst. The metal catalyst which promotes subsequent electroless metal deposition is selectively absorbed on the patterned cured resin and is converted to a catalytically active form. A conductive metal then is deposited selectively on the catalyst-containing patterned cured resin.

29 Claims, 4 Drawing Figures

PROCESS FOR PRODUCING PRODUCT HAVING PATTERNED METAL LAYER

REFERENCE TO RELATED APPLICATION

This application is a continuation-in-part of application Ser. No. 485,328, filed Apr. 15, 1983 now U.S. Pat. No. 4,555,414.

BACKGROUND OF THE INVENTION

This invention relates to a process for making a product having selective metal pathways which can function as an electrically conductive circuit.

Prior to the present invention, a wide variety of processes has been available for forming electrically conductive pathways on a non-electrically conducting substrate. For example, a metal film such as a film formed from copper can be applied to a non-conducting substrate to form a resultant laminate in a first step. Typical substrates include rigid composites of fiber glass and polyester or fiber glass and epoxy or plastic films of polyester or polyimide. In a commonly employed process, a layer of conductive metal such as copper is laminated, typically with the use of an adhesive layer, to the non-conductive substrate in a first step. A photoactivatible resin composition (photoresist) then is coated on the metal layer and is subsequently exposed to a light pattern using a light mask to reproduce the original metal pathway pattern desired followed by photoresist development. Metal etching then is effected in the area unprotected by the resist, thereby to produce the desired pattern. Alternatively, an etch resist can be directly printed such as by silk screen, gravure or the like on the metal laminate sheet followed by curing and metal etching. This multistep process is slow and time-consuming and utilizes an expensive metal laminated substrate such as a copper laminated substrate where much of the copper is etched off and subsequently wasted.

An alternative presently available process comprises direct circuit printing on a substrate utilizing a conductive metal-filled thick film ink or printing paste. In these processes, the conductive inks are limited to either very expensive silver or gold precious metals since they have the requisite high conductivity combined with resistance to oxidation. Attempts to utilize these conductive inks with less expensive nickel, copper or aluminum powder, for example, have proven to be unsatisfactory for many applications since these metals, in the form of fine powders, do not provide the requisite conductivity primarily due to surface oxidation. The less expensive and highly conductive copper metal is difficult to use in such a direct printing metal ink due to the rapid surface oxidation of the copper when in the form of fine powder such as irregular particles, spheres or flakes. Thus, this process is not amenable to manufacturing economical highly conducting copper circuitry patterns.

There are also highly specialized processes involving metal filled inks which have not found wide utility due to the difficulty in controlling the process. Printed inks containing nickel and zinc powder have been utilized in an augmentative replacement process to make conductive copper patterns once exposed to an acidic copper sulfate solution (U.S. Pat. Nos. 4,404,237 and 4,470,883). These inks will form conductive patterns, however, with insufficient conductivity for many printed circuit applications as the copper is interpenetrated with the ink's binding resin. As disclosed in U.S. Pat. No. 4,327,124, copper powder has been rolled onto a screen printed copper-containing ink to provide conductive patterns by the wire ink process. The conductive patterns are highly brittle due to the metal powder content and do not adhere well to common printed circuit substrates. Additionally, electron curing of screen printed inks has been developed. Both the wire ink process and the electron curing of screen printed inks have met with limited success primarily due to the extensive equipment needed which is not readily available. None of the above compositions are photoimagable and when screen printed have line resolution capability only of 10-15 mils.

In other processes, coatings containing noble or non-noble metals or metal salts dispersed as fine particles, usually in a polymeric binder, function as seed sites for subsequent plating with a metal. The polymeric compositions containing the metal or metal salt is applied to a substrate in the desired pattern. After being applied or printed, the composition is heat cured in order to drive off solvent and to cross-link the polymer. The high temperatures, e.g. 160° C., and extended cure times, e.g., 1-2 hours, required for these products limits their use to products having good high temperature stability where the products are made by batch processes. Palladium is a typical activating material and is an expensive raw material that is only partially utilized since only the surface metal and the metal immediately adjacent to the surface is actually used to initiate plating. All the remaining buried metal is not utilized and, therefore, constitutes an unnecessary expense. In addition to this expense of metal overburden, the availability and cost of precious/semiprecious metal is volatile. Furthermore, printed lines only about 5 mils or greater are possible so that electrically conductive circuitry produced thereby is highly limited. Finally, the presence of metallic catalyst within the patterned resin carrier will undesirably dissipate electrical current away from the conductive path coated on the patterned cured resin carrier during use of the circuit. This greatly reduces the efficiency of the circuit by raising power requirements and by increasing the probability of short circuiting during use. Typical examples of these processes are disclosed, for example, in U.S. Pat. Nos. 3,900,320, 3,775,176 and 3,600,330.

It has also been proposed to form electrically conductive metal pathways by a process which includes coating a substrate with a composition containing a reducible metal complex. In one such process, the photoforming process, a substrate is coated with a sorbitol copper formate solution containing a photoactivated reducing agent. Upon exposure to ultraviolet radiation, unmasked areas are reduced to copper metal and are suitable for plating nucleation sites. Non-exposed areas are washed clean and all copper formate is removed before plating can be carried out. Although the photo-reducible copper solution is readily applied and selectively ultraviolet radiation treated, plating selectivity becomes a severe problem due to the high incidence of copper formate remaining on non-desired areas of the substrate. This results in a low reliability of the photo-selective copper reduction process. Examples of this technology are set forth in U.S. Pat. Nos. 4,268,536, 4,181,750, 4,133,908, 4,192,764, 4,167,601 and 3,925,578.

Argon laser reduction of silver nitrate to silver in a polyamic acid matrix has been developed as a technique for forming fine metal lines as disclosed in U.S. Pat. No.

4,526,807. An additive method for producing patterns on glass is claimed utilizing a silver-containing photographic emulsion coated onto the entire glass surface. After exposure, development and burning off of gelatin, a silver pattern remains which can then be electrolessly plated (Ger.(East) DD No. 213,311). These processes have the same inherent difficulties as the photoforming process. Specifically, plating selectivity is difficult to achieve due to the presence of silver in non-desired areas of the substrate.

It has also been proposed to apply to a substrate non-metal containing coatings which are subsequently activated for plating by surface treatment with noble and/or non-noble metals or metal salts. Typical examples of these processes are shown in U.S Pat. Nos. 4,089,993, 4,073,981, 4,100,037 and 4,006,047. All of the coated substrates are heat cured and require elevated temperatures for long cure times. Examples of utilizing nonnoble metals such as copper, nickel or cobalt are shown in U.S. Pat. Nos. 4,006,047, 4,077,853 and 4,234,628. These systems all require the interaction of at least two non-noble metals for rendering a surface receptive to plating and are limited to complete plating coverage of an article and are not utilized in selective printing and plating to form electrically conductive pathways.

Selective additive plating on poly(phenylene sulfide) film is claimed by selectively doping non-laser-annealed areas of the film with iodine or arsenic pentafluoride. The doped areas are then not susceptible to electroless plating while the non-doped, but annealed, areas will serve as a template for electroless metal deposition. (U.S. Pat. No. 4,486,463). This process is unique to substrates such as poly(phenylene sulfide) which can be selectively doped to form semi-conductive pathways which then resist electroless plating.

The above-described plating art is utilized primarily to form electrically conducting metal pathways which function as electrical circuits in a wide variety of applications such as printed circuit boards using a relatively rigid base or so-called flexcircuits using a flexible plastic base where the circuit is sandwiched between two layers of flexible plastic. Typical bases for printed circuit boards include epoxy-fiber glass composites or phenolic-fiber glass composites. Typical bases for flexcircuits include polyimide and polyester. Polyimide, such as Kapton ®, is generally preferred for many applications because of high temperature stability needed for solder connections and service life. In forming such flexcircuits, the copper is laminated to the flexible polymer base, and then selectively etched to form the desired circuit. The printed circuit boards now utilized can be single sided, double sided or multilayered wherein electrically conductive paths are sandwiched between dielectric layers. The dielectric layer can be the rigid or flexible substrate of a resist. Thus, in known subtractive processes, the polymer base must be capable of withstanding the etching composition so that it is not degraded during circuit formation.

The above-described plating processes also can be utilized to form thin flexible resonant circuits which are useful for electronic security and article theft detection systems. While these circuits are electrically conductive, in use they are passive in that they are not used primarily as current carrying devices. Article theft detection systems are known in which electromagnetic waves are generated at a checkpoint and are caused to sweep repetitively at a given rate through a predetermined frequency range. A resonant electrical circuit tag is affixed to articles to be protected, the electrical circuit being resonant at a frequency within the swept frequency range. Changes in energy level which occur at a specific frequency within the swept repeating frequency band are detected, indicating the presence of the tag in the field. The electrical circuit comprises a coil and a capacitor connected to form a resonant loop. The tag circuit comprises an insulative substrate having one portion of the circuit formed on the opposite side of the substrate. Electrical connection is made between the portions of the circuit on opposite sides of the substrate by means of a conductive pin or eyelet extending through the substrate, or by means of a spot weld joining confronting circuit areas as disclosed, for example, by U.S. Pat. Nos. 3,863,244, 3,967,161, 4,021,705 and 4,369,557.

It would be highly desirable to provide a simpler, less costly and more rapid process for forming electrically conductive pathways on any one of a variety of non-conducting substrates. It would be desirable to provide such a process which eliminates the need for any metal etching step and which does not require the use of high temperatures or extensive curing time. By providing such a process, a wide variety of substrates, including thin film substrates or rigid substrates, could be utilized to support electrically conductive paths. Furthermore, it would be desirable to provide such a process for making very fine or thin electrically conductive pathways and a process whereby a dielectric, non-metal containing, resin is utilized. Such composite products could be utilized to produce metallized patterns such as those utilized on printed circuit boards, multilayer boards, electronic article surveillance circuit constructions utilized in article theft detection systems, decorative articles or the like.

SUMMARY OF THE INVENTION

In accordance with this invention, a composite article is produced comprising a substrate, a patterned resin bonded to the base and a metal layer bonded to the surface of the patterned resin to form patterned metal pathways. The metal pathways can be utilized to carry electrical current or can be utilized in a passive mode such as to form a resonant electrical circuit in response to electromagnetic waves at a given frequency such as in article theft detection devices, or can be merely decorative. A photosensitive resin composition is first coated on the substrate and dried to form a photosensitive dry film layer. The coated substrate then is exposed to actinic light capable of causing a reaction to occur within the irradiated portion of the resin in a patterned fashion. The photosensitive resins can be either negative acting or positive acting. Negative acting resins, upon exposure to actinic radiation, become insoluble in the solvent in which the original resin was soluble. Hence, after the developing step, the resin areas exposed to actinic radiation remain to form the patterned resin surface for subsequent plating. Positive acting resins, upon exposure to actinic radiation, become readily soluble in aqueous base or other solvents in the exposed areas. Hence, after the developing step, the resin areas not exposed to actinic radiation remain to form the patterned resin surface for subsequent plating. The substrate then is washed (developed) to entirely remove from the substrate the resin which is not in the pattern of the desired final metal layer. The resin pattern is free of metal or of composition capable of promoting electroless metal deposition. The patterned resin then is treated to activate the resin surface as by chemically modifying the surface. A catalytic metal composition then is deposited on the activated patterned resin. The catalytic metal composition is capable of subsequently catalyzing the electroless deposition of metal on the patterned resin. The electrolessly deposited metal can, in turn, be coated with subsequent layers of metal, either electrolessly or electrolytically deposited. Composite articles having alternating multiple layers of metal and non-metal can be formed by the process of this invention.

DESCRIPTION OF SPECIFIC EMBODIMENTS

Figure 1:
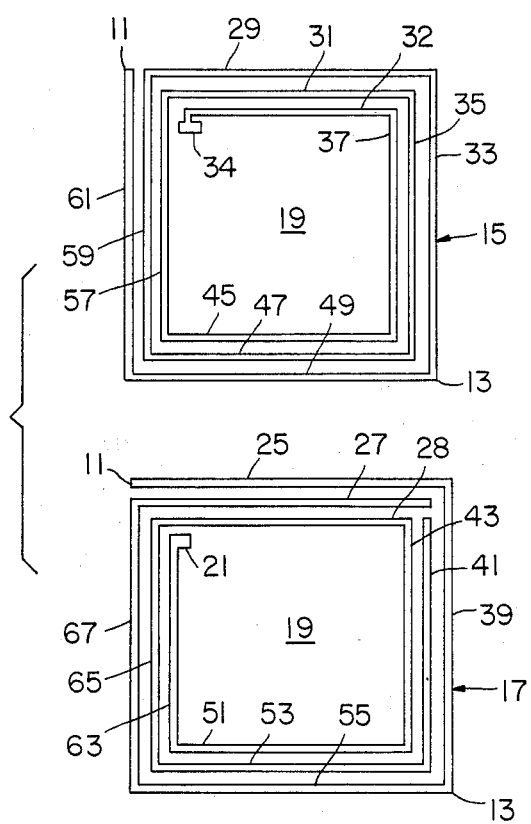
FIG. 1 is a resonant tag electronic article surveillance (EAS) circuit made in accordance with this invention.

In accordance with this invention, a photosensitive resin composition is coated onto a substrate, under conditions to prevent the resin from becoming cured. The photosensitive resin film then is exposed to actinic radiation capable of causing a reaction within the resin coating in the pattern of the desired final metal on the substrate. In the case of negative acting resins, the compositions polymerize/crosslink to become insoluble upon exposure to actinic light and in the case of positive acting resins, a reaction occurs generating ionic groups which enhance solvation of the exposed resin in a subsequently added solvent. The resin composition must have suitable dimensional stability to ensure retention of the photoimaged pattern. The particular means for effecting exposure is chosen with regard to the resin composition and final resolution for the required pathways. For example, when 0.001 to 0.10 inch pathways are required, it is preferred to employ ultraviolet radiation. Once exposed, the resin not in the desired pattern then is removed entirely from the substrate such as by washing with a suitable solvent (developing), thereby to prevent resin from remaining in a pattern other than that finally desired.

Once exposed to radiation, the patterned resin is selectively activated to modify the resin surface without activating the substrate, thereby rendering the resin receptive to catalytic metal deposition. In the case of positive acting resins, the activation step and subsequent steps are conducted to become soluble. The activated resin is contacted with a composition containing a catalytic metal or metal salt capable of subsequently catalyzing electroless deposition of the metal coating. The adsorbed metal catalyst is converted to an active catalytic state by treatment and then the pattern is rinsed. After these steps are completed, the patterned resin has been physically and chemically modified selectively while the substrate remains unmodified so that electroless deposition of metal thereon is effected selectively without effecting deposition on the substrate. Electroless or electrolytic plating in addition to the first electroless deposition can be used depending on end-use application.

Any flexible or rigid substrate can be utilized as the substrate in the process of this invention. Typical films or relatively rigid substrates include polymeric compositions containing polyamide, polycarbonate, polyester, polyetherimide, polyimide, polynitrocellulose, polyolefins such as polyethylene, polypropylene, poly(ethylenevinylacetate), poly-2-pentene, EPDM, polyionomers such as Surlyn ®, polyphenylene oxide, polyphenylene sulfide, polysulfone, polyethersulfone, polystyrene, polyvinylidene chloride or fluoride or the like. The preferred flexible substrates include polycarbonates, polyesters, polyetherimides, polyimides, polyolefins and polysulfones. Particularly for the flexible printed circuit industry, substrates such as polyimides (KAPTON ®), polyesters (Mylar ®), polycarbonates (Lexan ®) and polyetherimides (Ultem ®) are preferred due to their physical, electrical and thermal stability over wide temperature ranges, chemical inertness and radiation resistance. For decorative uses, polyolefins and other less expensive substrates are preferred where temperature and other stress requirements are less. Alternatively, rigid substrates can include ceramics, glass, plastics, paper compositions or the like; or composite substrates such as epoxy-fiber glass, epoxy-paper laminate, paper-fiber glass laminate, urea formaldehyde-fiber glass laminate, phenolic-fiber glass laminate, a polymeric fluorocarbon-fiber glass laminate or the like or with other reinforcing components such as carbon fiber, synthetic polymer fiber, pigments or the like. For rigid printed circuit applications, epoxy-fiber glass and epoxy-paper laminates are preferred. For other electronic and decorative uses, the substrate is specified individually. Representative decorative uses, for example, include designs, printed patterns or labeling of glass, paper, treated paper or plastic containers or other substrates such as flat glass or plastic substrates can be produced in accordance with this invention. On glass substrates, conductive patterns made with this process can be used for heating glass panels, photovoltaic devices, electromagnetic radiation control, optical exposure masks or the like.

It may be necessary to pretreat the substrate in order to improve adhesion such as with polyolefins by treatment with plasma or corona discharge in order to increase critical surface tension. Chemical treatment to modify the surface of the substrate can provide improved adhesion, for example, aqueous sodium hydroxide treatment of Kapton ® or sulfuric acid treatment of epoxy-fiber glass boards. Chemical treatment through the use of a tie coat is also known in the art, for example, the use of an adhesive layer on Mylar ® brand polyester or Kapton ® brand polyimide to improve the adhesion of subsequent coated or laminated layers. Any means well known in the art for pretreating plastic substrates for enhancement of adhesion is applicable to this invention.

The photosensitive coating can be applied to the substrate by a variety of means either in solution, dispersion or neat. When applied as a liquid, either in solution, dispersion or neat, the method of application can be, for example, rod or knife drawdowns, nip roll coating, reverse roll coating, three roll coating, two roll dip coating, knife coating, solution dipping, spinning or the like. Other methods of applications such as laminating, calendering and extrusion are possible with heat flowable compositions. When applied as dry resin, such as a powder, the application methods can include spraying, sputtering or dusting or the like. If the photosensitive coating is applied in solution, dispersion or any non-neat liquid, a 100% reactive film can be formed by evaporating solvent with heat or infrared. If it is applied neat, it can be photoimaged directly or, if desired and necessary, converted (cured) to a dry film by exposure to heat or actinic radiation (of different wavelength than that utilized to form a pattern).

It is preferred to utilize a curable 100% reactive resin composition which is curable at room temperature by radiation such as ultraviolet radiation, electron beam, x-ray or the like so that curing can be effected without adversely thermally degrading a wide variety of substrates, and solvent evaporation is not an environmental problem.

The requirements for the photosensitive resin vary with end-use requirements. For printed circuit boards, the resin must be resistant to water, humidity and solvents, have physical and electrical stability over a wide temperature range and have a coefficient of thermal expansion similar to the substrate to which it is applied. Once metal plated, the coating should be solderable. The adhesion of the printed resin to the substrate must be excellent; and on flexcircuits, it must be flexible. For decorative uses, the resin must be adherent to the substrate and flex if the substrate is flexible; other specifications apply for specific cases. In all cases, it is necessary that the resin coating be capable of permanently binding to the substrate, and forming a base for absorbing catalytic metal for subsequent metal plating thereto.

Both thermosetting resins and thermoplastic resins can be utilized. Representative examples of thermosetting resins are epoxies and urea- or phenol-formaldehyde based resins. Representative examples of thermoplastic resins are acrylic, urethane, amide, imide, and siloxane based resins. Any combination of the representative polymers in polyblends, copolymers or other composites are suitable. Typical reactive resin compositions for radiation induced free radical polymerization for negative acting resins are composed of photoinitiators; photoreactive prepolymers, such as acrylated urethanes; monomers such as pentaerythritol triacrylate and solvents, such as methyl ethyl ketone, diglyme, N-methyl pyrrolidone. Typical reactive resin compositions for radiation induced ionic polymerizations for negative acting resins are composed of photoinitiators; di- or multi-functional epoxies, such as the diglycidyl ether of Bisphenol A; and in some cases, multifunctional compounds such as diacids, diols and anhydrides. Typical reactive compositions for a photosensitive positive acting resin are composed of novolak resins, orthoquinone diazides, solvents, such as ethylene glycol monomethyl ether or butylacetate. Alternatively polymers can be blended into monomer/prepolymer mixtures to provide increased viscosity and/or phases for subsequent etching.

After actinic light exposure, the resin is washed to remove resin from the non-pattern areas. In typical examples, the exposed resin coated substrate is subjected to an aqueous base solution which dissolves the non-desired resin while leaving resin in the design pattern. Other developing solutions can be utilized, such as aromatic hydrocarbons, alcohols, esters, ethers, etc., depending upon the chemical make-up of the photosensitive resin. This process called development can be carried out by many techniques such as spraying, dipping or puddle processing or the like.

After washing (development), the resin is activated to provide attraction sites, such as metal chelation sites, for subsequent catalytic metal deposition and in some cases, to provide microvoids for increased adhesion of the metal plate. Activation sites for catalytic metal deposition and in some cases solvating one phase of the resin with a solvent to form microvoids (etching). Traditionally, chromic acid is used for materials such as acrylonitrile-butadiene-styrene (ABS) plastics. For the present invention, a wide variety of etchants are satisfactory as long as chemical modification and selective solvation of the patterned resin occurs. Depending on the resin system utilized, aqueous acid, aqueous alkali or aqueous organic base may be employed. In some cases, the use of a solvent/water mixture is desirable. Generally, aqueous base activation compositions can be used to activate polyacrylate, epoxy or polyetherimide patterned resins without activating polyethylene, polypropylene, polyimide or glass substrates. In a preferred embodiment, tetramethylammonium hydroxide can be used to activate resin compositions containing maleic anhydride incorporated into an acrylate matrix deposited on a polyimide, polyester, epoxy or polypropylene substrate. Aqueous acid activating compositions can be used to activate epoxy based compositions including epoxidized polyglycidyl ethers or epoxidized novolac resins coated on a polypropylene, polyimide, polyetherimide or polysulfone substrate. In any event, the activating agent is chosen so that it chemically modifies the patterned resin to provide metal chelation sites without chemically modifying the substrate. By operating in this manner, it is now possible to selectively add catalyst to the patterned resin followed by electroless metal deposition without retention of catalyst or electrolessly deposited metal on the substrate. Development and activation may occur in the same process step, not requiring two separate process baths. Subsequent to activating, the resin must have catalytic metal absorbed into and onto the resin. Typically, palladium-tin combination baths are used for plating on plastics. The preferred method for this invention is the use of a non-noble metal catalyst system using nickel and copper, or nickel alone. The requirement for this catalytic metal is that it permits and aids in the deposition of a metal onto the resin by electroless plating. Once the catalytic metal has been deposited on the resin surface, further treatment such as using a citric acid wash for Pd/Sn baths or reduction using sodium borohydride, amine boranes, hydrazines or aldehydes for Cu/Ni baths may be required. This post-treatment can be necessary to reduce the catalytic metal to an active state, such as a zero valence state, and hence render it catalytic towards electroless plating. After catalyst deposition, thorough rinsing is conducted to ensure the removal of excess, loose catalytic metal either on the patterned coating or on the substrate. Excess, loose catalytic metal lying on the pattern can cause lack of electroless metal adhesion, or loose catalytic metal on the substrate can cause lack of selectivity of the subsequent metal plate or loose catalytic metal can be carried forward into the subsequent metal electroless plating bath and cause poisoning. Any electroless metal plating bath is suitable for this application; that is, a process which deposits metal out of a solution of metallic salt where there are no outside sources of current; therefore, the necessary electrons in the solution are produced by a chemical process rather than electrolytically. Representative metals that can be applied in this manner are copper, nickel, gold, silver, tin, lead, palladium and platinum. Copper is preferred as it is conductive, ductile and relatively inexpensive. The metal to be plated can be varied depending on the desired conductivity or resistivity or color. In the same circuit pattern, for instance, it may be desired to incorporate selected areas of resistance by plating with silver/palladium or other metals in various thicknesses and widths, in addition to plating selected areas for conduction with copper or nickel. The primary requirements for printed circuit boards are metal adhesion to the patterned resin, resin flexibility to match the flexibility of the substrate, conductivity, abrasion resistance, resin/substrate having similar coefficients of expansion, and resistance to humidity and temperature cycling. For decorative applications, the primary requirements are adhesion to the patterned resin, flexibility to match the flexibility of the substrate and abrasion resistance.

Subsequent to electroless deposition of metal, additional layers of metal can be deposited on all or a portion of the electrolessly deposited metal. For example, the substrate plated with electrolessly deposited metal can be dipped in molten metal, such as Sn-Pb, or it can be treated in an electroless or electrolytic bath of the same or a different metal depending on the end-use requirements. Representative suitable additional metal layers can comprise copper, nickel, silver, gold, tin, tin-lead or the like. In the preferred embodiment of this invention, the electroless metal coating is coated with copper or nickel in an electrolytic bath. The electroless and electrolytic baths may employ any known-to-the-art chemical constituents and may employ any technique known to the art, such as baths or brush plating.

In one aspect of this invention, multilayers of metals can be applied to a common substrate with dielectric layers being interposed between adjacent metal layers in order to form three dimensional electro-conducting paths on a given substrate. This can be done by forming a second patterned layer of a photosensitive resin in the manner described above with suitable holes in each subsequently applied resin layer in order to expose only a portion of the first applied metal layer to subsequent metal layers. Thereafter, each subsequently applied resin layer is activated in the manner described above so as to form a metal layer on the newly applied exposed, activated resin and to plate the interior of the holes within the resin so that metal layers can be connected with adjacent metal layers by a metal coating on the interior walls of the hole in the intermediate patterned resin layer.

As stated above, the electrolessly applied metal layer can, in turn, be coated with one or more additional metal layers either electrolessly or electrolytically. In a preferred form of this invention, an electrolytically applied layer of metal is deposited on the metal layer. It has been found that in many instances, the electrolytically applied layer is more uniform and less likely to contain voids. Copper, electrolytically applied, comprises a particularly useful embodiment.

Components such as coils and capacitors can be integrated into the conducting patterns, by using the substrate as the dielectric of the capacitor and conductive patterns opposite each other. A coil can be made as a flat coil with the conductive windings on one side of the substrate or by connecting half windings on both sides of the substrate with through holes.

Referring to FIG. 1, a resonant circuit comprising the present invention which has a center frequency of 8.1 MHz is shown. This circuit is formed by overlapping points 11 to each other and points 13 to each other on opposing surfaces of an insulating layer. Conductive path 15 is provided on one surface and conductive path 17 is provided on the opposing surface. A conductive path extends through the insulating layer 19 and is connected to points 21 and 34 on opposing surfaces of the insulating layer 19 so that the conductive paths 15 and 17 are connected thereby. The conductive paths 15 and 17 overlap each other on windings 25, 27 and 28 which overlap windings 29, 31 and 32. Windings 33, 35 and 37 overlap windings 39, 41 and 43, respectively. Conductive paths 45, 47 and 49 overlap conductive paths 51, 53 and 55, respectively, while conductive paths 57, 59 and 61 overlap conductive paths 63, 65 and 67, respectively. Utilizing this design, a discrete capacitor can be eliminated and the conductive paths 15 and 17 cooperate together to provide both the inductor function and the distributed capacitor function. On one side of the tag, the inductor line is only about 18 inches and the line width varies from between about 0.08 inches and 0.06 inches. The total surface area utilizing the design of the present invention, the discrete capacitor can be eliminated and the size of the overall tag can be made much smaller than that which can be made by the prior art designs.

Figure 2:
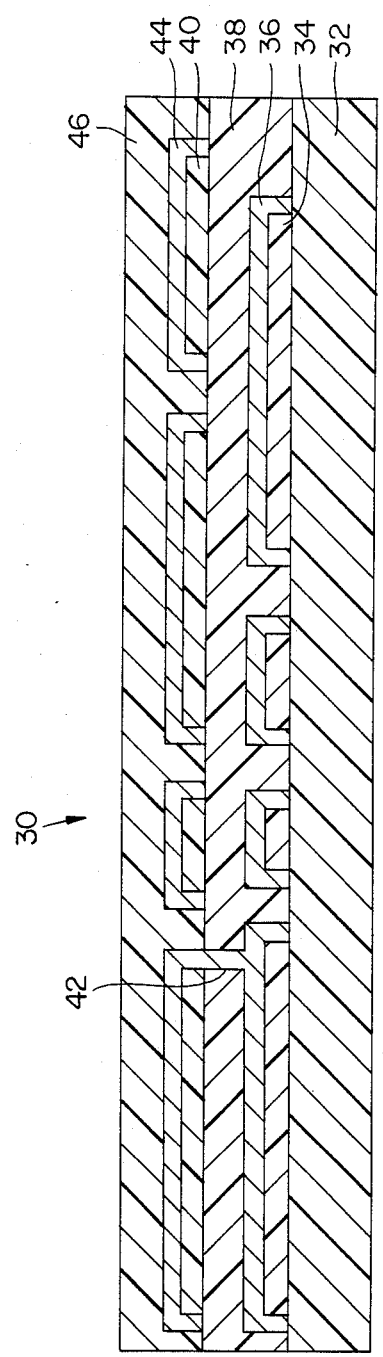
FIG. 2 is a cross-sectional view of a multilayer circuit made in accordance with this invention.

Referring to FIG. 2, a composite article 30 having a plurality of metal layers is shown from a cross-sectional view. The composite article 30 includes a substrate 32 which can be made of a rigid composite or flexible composition. A plated metal layer 36 is bonded to the patterned resin layer 34. A dielectric layer 38 is applied to insulate metal layer 36 and substrate 32 and is provided with a hole 42 which can be made in any convenient manner such as by positioning a pin (not shown) on layer 36 during application of layer 38 or with printing techniques. A second patterned resin 40 containing an activator is selectively applied to layer 38 and is also provided with a hole 42 which can be made in any convenient manner. A second electrolessly applied metal layer 44 then is deposited on layer 40. Layer 44 is connected to layer 36 through hole 42. A photosensitive resin layer 46 then can be applied to layer 44, if desired.

Figure 3:
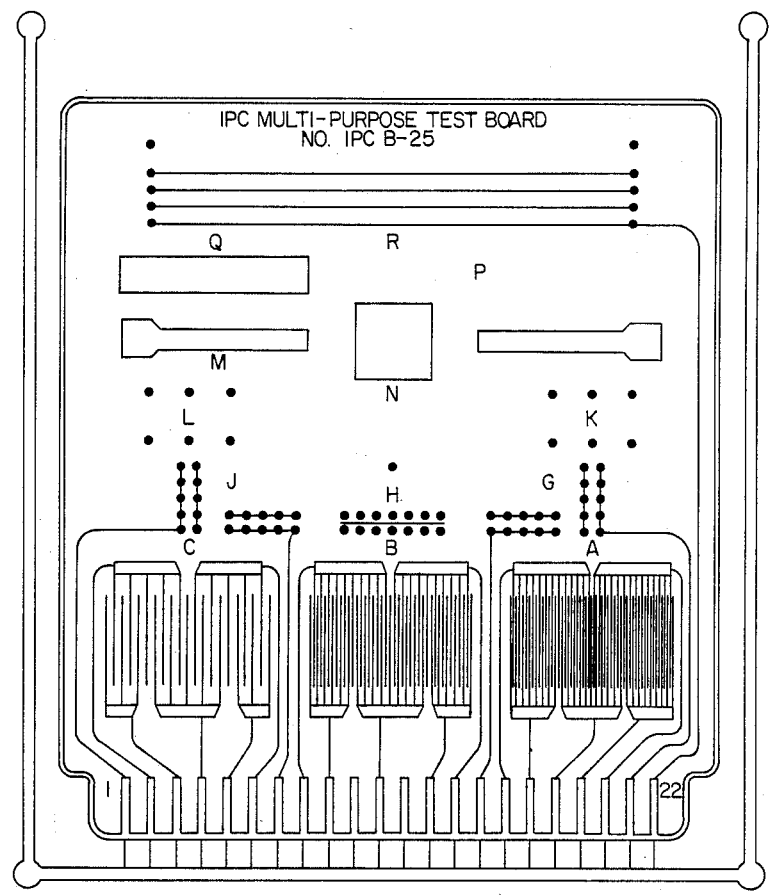
FIG. 3 is side one of Mil Spec Pattern B-25.
Figure 4:
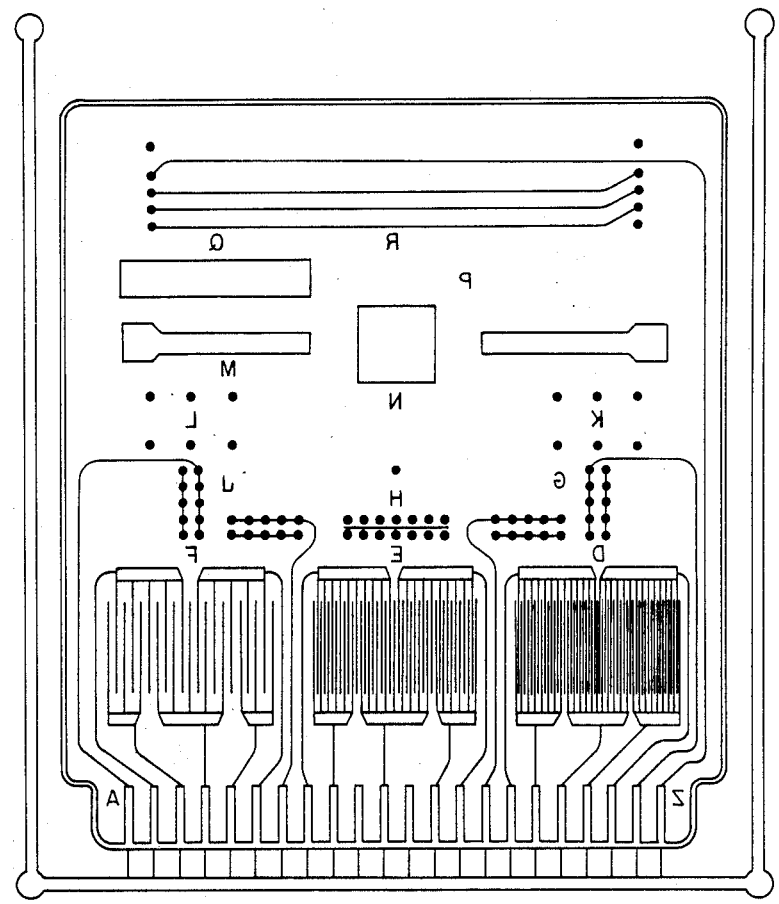
FIG. 4 is side two of Mil Spec Pattern B-25.

Referring to FIGS. 3 and 4, the IPC-B-25 Multipurpose 2 sided circuit test pattern is shown. This is a certification pattern for MIL-P-55110C.

The following examples illustrate the present invention and are not intended to limit the same.

EXAMPLE I

This example illustrates making a single sided flexible circuit pattern on polypropylene.

A 0.70 mil thick polypropylene film, previously corona treated, is coated on the treated side with an ultraviolet radiation curable 100% solids epoxy based composition comprising 20 wt % polyglycidylether of phenol-formaldehyde novolac, 20 wt % cycloaliphatic diepoxide, 10 wt % diglycidyl ether of polypropylene glycol, 50 wt % $SiO_2$ and a cationic photoinitiator, such as triphenyl sulfonium hexafluoroantimoniate. The resin is applied over the entire film surface.

The film is exposed to a 200 watts/in mercury vapor discharge lamp (American Ultraviolet Portacure 1500), having a maximum intensity wavelength range from 200–400 nm for 30 seconds at a lamp to substrate distance of 5 inches through a mask which allows UV light to pass through in the same pattern as the circuit finally desired.

The exposed coating in the desired circuit pattern is completely cured as evidenced by lack of tack, scratch resistance and lack of solubility. Excess uncured resin then is developed from the film by immersing the film in 96% sulfuric acid at 55° C. for 45 seconds. This step also sensitizes and renders the patterned resin, but not the polypropylene substrate, susceptible to plating. After developing/sensitizing, the pattern is rinsed thoroughly with water and immersed in a catalyst bath containing 0.1 m $CuSO_4.5H_2O$, 0.1 m $NiSO_4.6H_2O$, 0.1 m citric acid, 0.33 m sorbitol adjusted to pH 4.2 with NaOH. The pattern is immersed in the above bath for 5 seconds at room temperature. The pattern is rinsed and immersed in a 3 wt % sodium borohydride bath at pH 10.4 for 15 seconds. After thorough rinsing with water, the pattern, but not the substrate, is ready for selective copper plating. An electroless copper bath comprising 0.03 m copper sulfate, 0.08 m formaldehyde, 0.125 m sodium hydroxide, 0.036 m ethylene diamine tetraacetic acid, sodium salt, $4 \times 10^{-4}$ m sodium cyanide and deionized water is employed to selectively plate copper onto the activated resin pattern. The pattern is immersed for 15 minutes or longer with the bath temperature at 55° C. to form the electrolessly-applied layer of copper.

The above procedure has been followed on various thicknesses (0.2 to 2 mil) of polypropylene film and on 2 mil polyethylene film. In addition, commercial electroless plating baths, Enduroplate 407 from Philip A. Hunt Chemical Corporation, and Macuplex 70 from McDermid, Inc. can be utilized for electroless plating of the exposed, developed and activated coating.

EXAMPLE II

This example illustrates making a double sided flexible passive circuit pattern, an electronic article surveillance tag as shown in FIG. 1.

A 0.70 mil thick polypropylene film, previously corona treated on two sides and containing a punched through-hole, is sequentially coated, imaged and developed to yield the patterned coating on each side individually with the ultraviolet radiation curable, epoxy based composition as set forth in Example I.

Each side individually of the coated film is exposed to UV and developed/sensitized as in Example I. Once both sides of the circuit are patterned with the cured resin, the entire circuit is immersed in a catalyst bath, followed by a sodium borohydride bath and an electroless copper bath as in Example I.

The conductive tag is then dried and laminated with paper cover sheets to form the final product. The tag has a resonant frequency of 8.0 mHz.

EXAMPLE III

This example illustrates making a single sided flexible printed circuit on polyester film.

A 4.5 mil thick polyester film is coated with an ultraviolet radiation curable 100% solids coating composition comprising 50 wt % polyurethane diacrylate, 20 wt % maleic anhydride, 15 wt % N-vinyl pyrrolidone, 15 wt % trimethylol propane triacrylate and a free radical photoinitiator such as 2,2-dimethoxy-2-phenyl acetophenone (DEAP).

The coated substrate is exposed to ultraviolet radiation having a wavelength of 200–400 nm from a 200 watts/in mercury vapor discharge lamp for 30 seconds at a distance of 5 inches in a light pattern the same as the configuration of the desired circuit. The uncured resin is removed from the film by developing in ethyl acetate. At this time, the patterned coating is completely cured as evaluated by lack of tack, scratch resistance and lack of solubility.

The printed pattern is rendered susceptible to plating by sensitizing and activating steps. Sensitization is accomplished by immersion of the pattern in a 2.5 wt % aqueous tetramethylammonium hydroxide solution at room temperature for 10 minutes. After sensitization, the pattern is rinsed thoroughly with water and immersed in a catalyst bath containing 0.1 m $CuSO_4.5H_2O$, 0.1 m $NiSO_4.6H_2O$, 0.1 m citric acid, 0.33 m sorbitol adjusted to pH 4.2 with NaOH. The pattern is immersed in the above bath for 1 minute at room temperature. The pattern is rinsed and immersed in a 3 wt % sodium borohydride bath at pH 10.4 for 30 seconds. After thorough rinsing with water, the pattern is ready for copper plating. The activated patterned resin is plated as in Example I.

The above procedure can also be utilized on other substrates such as polyethylene film, polypropylene film, polyimide film, polycarbonate film, polyetherimide film or polysulfone film.

EXAMPLE IV

This example illustrates making a multilayer circuit as in FIG. 2. A 0.75 mil thick composite polypropylene film consisting of a polypropylene inner layer and surface coated on two sides with a polyethylene/propylene resin and corona treated on two sides and containing a punched through-hole, is coated on each side individually with the ultraviolet radiation curable composition of Example I.

The coated film is exposed, developed, sensitized, activated with catalyst and plated as in Example I.

After drying, the conductive double sided circuit is then heat laminated on each side with the above-treated composite polypropylene film containing a punched through-hole. A second circuit pattern is printed on each side individually of the double sided circuit with the ultraviolet radiation curable composition of Example I.

The coated second layer of the multilayer circuit is exposed, developed, sensitized, activated with catalyst and plated as in Example II. At this point, four layers of conductive circuitry are formed.

This procedure may be repeated as necessary to increase the number of layers for a desired final multilayer circuit.

Using the ultraviolet radiation curable composition and procedure of Example III, other substrates can be utilized such as polyester, polyimide, polycarbonate, polyetherimide or polysulfone utilizing other lamination means such as solvents or adhesives. Rigid substrates such as epoxy-fiber glass and phenolic-fiber glass laminates can also be utilized; any combination of flexible and rigid substrates are suitable for the fabrication of multilayer circuits using the process of this invention and appropriate laminating means.

EXAMPLE V

This example illustrates making a single sided rigid printed circuit board.

A 56 mil thick epoxy-fiber glass board is coated with the ultraviolet radiation curable composition of Example III. The coated board is exposed, developed, sensitized, activated with catalyst and plated as in Example III.

The above procedure can also be utilized on other rigid substrates such as urea formaldehyde-fiber glass and phenolic-fiber glass laminates.

In addition, touch sensitive switches such as in keyboard and membrane circuits can be fabricated using the ultraviolet radiation curable composition and procedure of Example III utilizing substrates such as polyolefins, polyester, polyimides, polycarbonates, polyetherimides or polysulfones.

EXAMPLE VI

This example illustrates making a circuit sample in the pattern of IPC-B-25 shown in FIGS. 3 and 4.

A 3.0 mil thick Kapton brand polyimide film is coated by Meyer rod drawdown with a positive acting composition comprising 0.25 grams of hexamethoxymethyl melamine, 7.4 g of cresol novolak resin of 7,500 molecular weight, 1.85 g of napthoquinone 1-oxo-2-diazido 5-(2,3,4 trihydroxybenzophenone) sulfonate, and 50 grams of cellosolve acetate. The coating is dried for 15 minutes at 100° C. and then photoimaged through a circuit pattern mask utilizing a 200 watts/in lamp (American Portacure 1500) at 15 inch height above the coating for 10 minutes. The coating is developed and activated by removing the exposed film coating with 1.0 N NaOH at room temperature for 3 minutes. After developing and activating the image, the coating is sequentially exposed to a commercial palladium/tin bath, Macuplex D-34 (McDermid, Inc.) for 3 minutes at room temperatures; commercial accelerator bath, Cuposit Accelerator 19 (Shipley Company) for 45 seconds at room temperature and a commercial electroless copper bath, Enduroplate EP 407 (Philip A. Hunt Chemical Co.) for 10 minutes at room temperature. The electroless copper deposited uniformly on the activated, patterned coating to a thickness of $10\mu'$ inches with excellent adhesion.

EXAMPLE VII

This example illustrates making a single sided flexible printed circuit sample in the pattern of IPC-B-25 shown in FIG. 3.

A 3.0 mil thick Kapton brand polyimide film is coated by Meyer rod drawdown with a composition comprising 17 grams of polyethylene glycol 200 diacrylate, 17 grams of ethoxylated bisphenol A diacrylate, 17 grams of pentaerythritol tetra-3-mecaptopropionate, 5 grams of a maleic anhydride/styrene copolymer (Scripset 520, Monsanto), 45 grams of Acetone and 1.7 grams of 1-Hydroxycyclohexyl phenyl ketone (Irgacure 184, CIBA-GEIGY) The coating is dried for 30 minutes at 100° C. and then is exposed, developed, activated and plated as in Example VI.

EXAMPLE VIII

This example illustrates making a single sided printed circuit on glass.

A 6"×6" piece of 1.0 mm thick glass is coated by Meyer rod drawdown with a composition comprising 0.5 grams of maleic anhydride/styrene copolymer (Scripset 520, Monsanto), 0.5 grams tris-(2-acryloxyethyl)isocyanurate, 0.05 grams of 3-methacryloxypropyltrimethoxysilane, 2.5 grams of N-methyl pyrrolidone and 0.3 grams of 1-Hydroxycyclohexylphenyl ketone. The coated glass is dried for one hour at 100° C. and then is exposed, developed, activated and plated as in Example VI. The copper metallized pattern is totally opaque to UV/visible light and adheres well to the glass surface. Alternatively, the photoimaged, developed and activated coating pattern can be plated any electroless nickel bath, such as Enplate Ni-8632 (Enthone, Inc.) or Niklad 752 (Allied Kelite Div. Witco Chemical Corp.) instead of electroless copper.

The above coating composition and procedure can also be utilized on silicon wafer substrates or tinoxide coated substrates.

We claim:

1. The process for forming a composite product which comprises applying to a base a layer of a photosensitive resin, exposing said resin to actinic light in a pattern to form a solvatable resin and a patterned non-solvatable resin, removing solvatable resin by contacting said solvatable resin with a solvent for the solvatable resin, chemically modifying said patterned resin to render the surface of said resin receptive to a catalyst capable of promoting electroless metal deposition without chemically modifying said base, contacting said chemically modified patterned resin with a catalyst composition capable of promoting electroless metal deposition, thereby to absorb said catalyst on said patterned layer, rinsing said patterned resin and said base to remove excess loose catalyst therefrom, converting said absorbed metal catalyst to an electrolytically active form capable of causing electroless metal deposition and electrolessly depositing a metal layer on said patterned resin selectively without effecting electroless deposition of said metal layer on said base.

2. The process of claim 1 wherein said base is a flexible substrate.

3. The process of claim 1 wherein said base is a rigid substrate.

4. The process of claim 1 wherein said metal layer is copper.

5. The process of claim 1 wherein said metal layer is nickel.

6. The process of claim 1 wherein the resin is chemically modified with aqueous alkali.

7. The process of claim 1 wherein the resin is chemically modified with quaternary ammonium hydroxide.

8. The process of claim 1 wherein the resin is chemically modified with aqueous acids.

9. The process of claim 1 wherein said photosensitive resin is cured when exposed to said actinic light.

10. The process of claim 1 wherein said photosensitive resin is rendered more solvatable in a solvent when exposed to said actinic light.

11. The process of claim 1 wherein said photosensitive resin is rendered less solvatable in a solvent when exposed to said actinic light.

12. The process of claim 1 wherein said catalyst composition comprises copper and nickel.

13. The process of claim 1 wherein said catalyst composition comprises copper/nickel boride.

14. The process of claim 1 wherein said catalyst composition comprises palladium and tin.

15. The process of claim 1 wherein said catalyst composition comprises nickel boride.

16. The process of claim 1 wherein said actinic light is ultraviolet light.

17. The process of claim 1 wherein said base comprises a polyimide composition.

18. The process of claim 1 wherein said base comprises a polyester composition.

19. The process of claim 1 wherein said base comprises a polyolefin composition.

20. The process of claim 1 wherein said base comprises a polycarbonate composition.

21. The process of claim 1 wherein said base comprises a polyetherimide composition.

22. The process of claim 1 wherein said substrate comprises a composite of a resin and a reinforcing component.

23. The process of claim 1 wherein said patterned photosensitive resin composition comprises an epoxy containing resin composition.

24. The process of claim 1 wherein said patterned photosensitive resin composition comprises a novolak containing resin composition.

25. The process of claim 1 wherein said patterned photosensitive resin composition comprises acrylic containing resin composition.

26. The process of claim 1 wherein said patterned photosensitive resin composition comprises an unsaturated polyolefin containing resin composition.

27. The process of claim 1 wherein a second metal layer is bonded to said first metal layer bonded to the patterned resin.

28. The process of claim 1 wherein a second metal layer is electrolytically applied to said first electroless metal layer.

29. The process of claim 1 wherein a second metal layer is electrolessly applied to said first electroless metal layer.

* * * * *